(12) United States Patent
Kim et al.

(10) Patent No.: US 9,419,654 B2
(45) Date of Patent: Aug. 16, 2016

(54) ENCODING DEVICE AND METHOD FOR GENERATING MESSAGE MATRIX

(71) Applicants: SK HYNIX INC., Icheon (KR); Korea Advanced Institute of Science and Technology, Daejeon (KR)

(72) Inventors: Dae-Sung Kim, Gwangju (KR); Jeong-Seok Ha, Daejeon (KR); Chol-Su Chae, Icheon (KR); Seok-Jin Joo, Seoul (KR); Sang-Chul Lee, Yongin (KR)

(73) Assignees: SK HYNIX INC., Icheon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 140 days.

(21) Appl. No.: 14/498,374

(22) Filed: Sep. 26, 2014

(65) Prior Publication Data

US 2015/0194985 A1 Jul. 9, 2015

(30) Foreign Application Priority Data

Jan. 9, 2014 (KR) .................. 10-2014-0002873

(51) Int. Cl.
*H03M 13/00* (2006.01)
*H03M 13/29* (2006.01)
*H03M 13/15* (2006.01)

(52) U.S. Cl.
CPC .......... *H03M 13/2906* (2013.01); *H03M 13/15* (2013.01); *H03M 13/616* (2013.01)

(58) Field of Classification Search
CPC ............ H03M 13/2906; H03M 13/15; H03M 13/616; H03M 13/1171; H03M 13/1185; H03M 13/611; H03M 13/6356; H03M 13/6368; H03M 13/1102; H03M 13/6306; H03M 13/1165; H03M 13/255; H03M 13/2707; H04L 1/1829; H04L 1/0057; H04L 1/0054; H04L 1/0058

See application file for complete search history.

(56) References Cited

U.S. PATENT DOCUMENTS

| | | | |
|---|---|---|---|
| 8,065,598 B1 * | 11/2011 | Gunnam | H03M 13/116 714/800 |
| 8,656,244 B1 * | 2/2014 | Chang | H03M 13/1171 714/752 |
| 2010/0195571 A1 * | 8/2010 | Kuri | H03M 13/1102 370/328 |
| 2010/0241925 A1 | 9/2010 | Wang et al. | |
| 2011/0113312 A1 * | 5/2011 | Kobayashi | H03M 13/116 714/801 |
| 2012/0051460 A1 * | 3/2012 | Jeong | H03M 13/1165 375/298 |
| 2012/0089884 A1 * | 4/2012 | Kamiya | H03M 13/116 714/752 |
| 2013/0305113 A1 * | 11/2013 | Shinohara | H04L 1/0058 714/752 |

* cited by examiner

*Primary Examiner* — Guerrier Merant

(57) ABSTRACT

A method for arranging a plurality of message blocks in a lattice form and generating a message matrix includes deciding lengths of rows of the message matrix such that a length difference is equal to or less than a first critical point, deciding lengths of the message blocks such that a length difference is equal to or less than a second critical point, and arranging the message blocks in each row of the message matrix such that a length difference of columns of the message matrix is equal to or less than a third critical point.

20 Claims, 8 Drawing Sheets

ENCODING DEVICE AND METHOD FOR GENERATING MESSAGE MATRIX

The present application claims priority under 35 U.S.C. §119(a) to Korean Patent application number 10-2014-0002873, filed on Jan. 9, 2014, in the Korean Intellectual Property Office, which is incorporated herein by reference in its entirety as set forth in full.

BACKGROUND

1. Technical Field

The present disclosure relates to an encoding device and a method for generating a message matrix. Particularly, the present disclosure relates to an encoding device that allocates a plurality of message blocks having different lengths in a lattice form and generates a message matrix, and a method for generating the message matrix.

2. Related Art

Block-based coding technologies are used for error detection and correction. Concatenated Bose—Ray-Chaudhuri—Hocquenghem (BCH) codes are one type of error detection and correction codes.

To apply a concatenated BCH code, a message matrix is formed having a plurality of message blocks arranged in a lattice form, that is, into rows and columns, and error correction codes (parities) are generated for each row and each column of the message matrix.

In regular concatenated BCH code technology, the same number of bits are included in each message block of the message matrix. To accomplish this, a meaningless message area (e.g., zero padding) may be added to each row and each column of the message matrix, resulting in inefficient use of parities.

In irregular concatenated BCH code technology, the number of bits included in each message block of the message matrix is not required to be the same. As a result, in a message matrix generated using the irregular concatenated BCH code technology, message lengths of each row may differ from message lengths of other rows, and message lengths of each column may differ from message lengths of other columns. As a result, the protection performance provided by the row parities may differ for each row, and the protection performance provided by the column parities may differ for each column.

SUMMARY

An encoding device which generates a message matrix such that the protection performance for each row and each column of a message matrix is uniformly maintained at maximum when the lengths of message blocks of the message matrix are not equal to one another and an operation method thereof are described herein.

In one embodiment of the present disclosure, a method, which arranges a plurality of message blocks in a lattice form and generates a message matrix, includes: deciding lengths of rows of the message matrix such that a length difference is equal to or less than a first critical point; deciding lengths of the message blocks such that a length difference is equal to or less than a second critical point; and arranging the message blocks in each row of the message matrix such that a length difference of columns of the message matrix is equal to or less than a third critical point.

In another embodiment, a method, which arranges a plurality of message blocks in a lattice form and generates a message matrix, includes: deciding lengths of columns of the message matrix such that a length difference is equal to or less than a first critical point; deciding lengths of the message blocks such that a length difference is equal to or less than a second critical point; and arranging the message blocks in each column of the message matrix such that a length difference of rows of the message matrix is equal to or less than a third critical point.

In another embodiment, an encoding device includes: a message matrix generator that generates a message matrix in which a plurality of message blocks are arranged in a lattice form such that a length difference of rows of the message matrix is equal to or less than a first critical point, a length difference of the message blocks is equal to or less than a second critical point, and a length difference of columns of the message matrix is equal to or less than a third critical point; and a parity encoder that generates a parity code in the message matrix.

In embodiments, the lengths of message blocks are variable, and the parity protection performance for rows and columns of a message matrix can be uniformly maintained at a maximum. In embodiments, a message matrix is generated that enables improved protection performance by parity codes as compared with the prior art.

BRIEF DESCRIPTION OF THE DRAWINGS

Features, aspects, and embodiments are described in conjunction with the attached drawings, in which:

FIG. 4 is a diagram illustrating lengths of message blocks of a message matrix according to an embodiment;

FIG. 6 is a diagram illustrating the lengths of message blocks of a message matrix produced according to the process of FIG. 5;

DETAILED DESCRIPTION

Hereinafter, an encoding device and a process for generating a message matrix according to the present disclosure will be described in detail with reference to the accompanying drawings.

Figure 1:
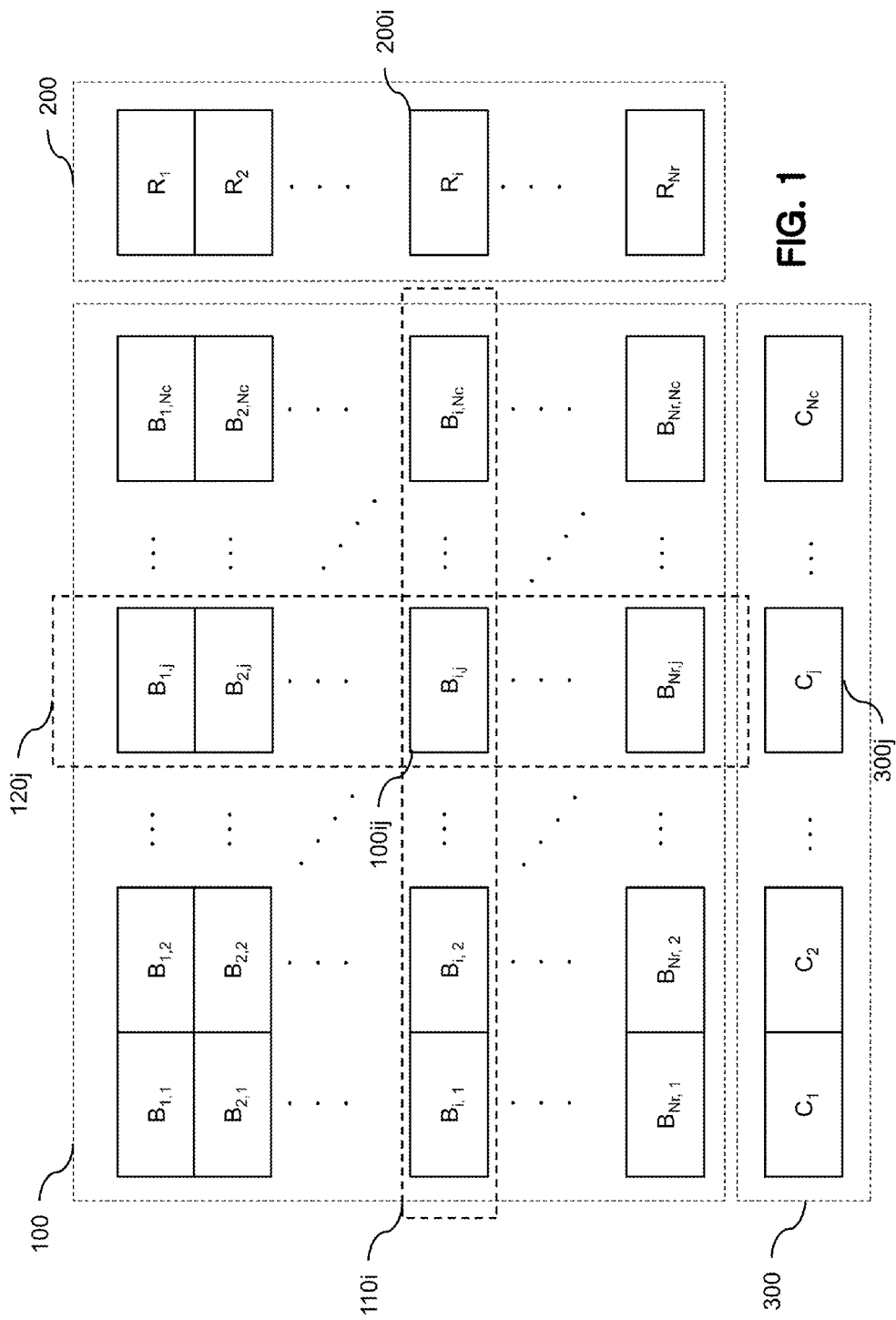
FIG. 1 illustrates a message matrix according to an embodiment.
Figure 2:
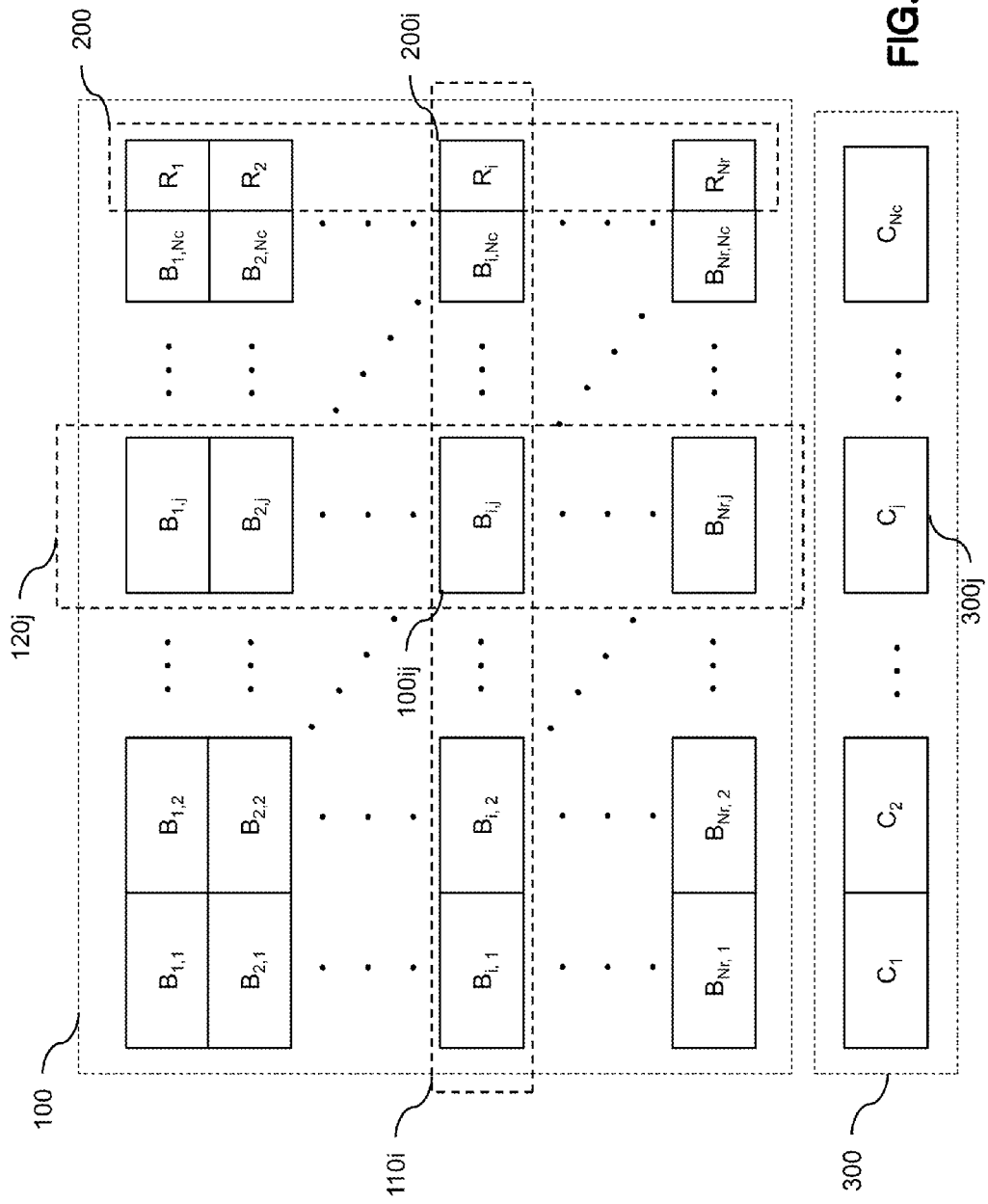
FIG. 2 illustrates a message matrix according to another embodiment.

FIG. 1 and FIG. 2 are diagrams illustrating the structure of a message matrix 100 according to embodiments of the present disclosure. The message matrix 100 includes a plurality of row message blocks $110_i$ and a plurality of column message blocks $120_j$, wherein, for a number of rows $N_r$ and a number of columns $N_c$, i=1 ... $N_r$ and j=1 ... $N_c$. A row message block $110_i$ includes a plurality of message blocks arranged along a row i, and a column message block $120_j$ includes a plurality of message blocks arranged along a column j. Thus, a specific message block $100_{ij}$ is located at an intersection of the row i and the column j.

FIG. 1 illustrates an embodiment in which row parity information 200 and column parity information 300 are concatenated in a parallel manner, wherein the row parity information 200 and the column parity information 300 are concatenated to the message matrix 100 after the message matrix 100 is generated from a message. The row parity information 200 includes a plurality of row parity blocks $200_i$, wherein i=1 ... $N_r$. The column parity information 300 includes a plurality of column parity blocks $300_j$, wherein j= 1 ... $N_c$.

FIG. 2 illustrates an embodiment in which row parity information 200 and column parity information 300 are concatenated in a serial manner, wherein the row parity blocks $200_1$ ... $200_{Nc}$ of the row parity information 200 are included as a part of row message blocks $110_1$ ... $110_{Nr}$ of the message matrix 100, respectively. Accordingly, in order to generate the message matrix 100 using serial concatenation, it is necessary to consider the length of a message and the length of the row parity information 200.

As shown in FIGS. 1 and 2, each row message block $110_i$ includes the $i^{th}$ message block of each of the first through $N_c^{th}$ column message blocks $120_1$ through $120_{Nc}$. Each column message block $120_j$ includes the $j^{th}$ message block of each of the first through $N_r^{th}$ row message blocks $110_1$ through $110_{Nr}$.

Regardless of whether parallel or serial concatenation is used, each of the message blocks $100_{ij}$ of the message matrix 100 of FIG. 1 and FIG. 2 may be protected by the row parity block $200_i$ and the column parity block $300_j$, respectively.

Embodiments of the present disclosure are not dependent on any particular coding technology for generating a row or column parity block. For example, a parity block may be generated using a BCH code, a Hamming code, a Reed Solomon (RS) code, or another type of parity, error detection, or error correction code technology. Accordingly, parity information, as used herein, may include one or more of a parity bit, checksum, cyclic redundancy check, hash, error correcting code (ECC), and the like.

Embodiments relate to a process for deciding the length of each message block $100_{ij}$ of the message matrix 100 when the length N of the message matrix 100, the number of rows $N_r$ in the message matrix 100, the number of columns $N_c$ of the message matrix 100, the length of the row parity blocks $200_i$, and the length of the column parity blocks $300_j$ have been previously decided.

Particularly, embodiments relate to a process for deciding respective lengths of the message blocks $100_{ij}$ when the lengths of the row message blocks $100_i$ of the message matrix 100 are different from one another and/or the lengths of the column message blocks $120_j$ are different from one another, as may occur when using the irregular concatenated BCH code technology.

Because embodiments relate to a process for allocating the message blocks $100_{ij}$ according to lengths in the message matrix 100 regardless of whether parallel or serial concatenation is used, for illustrative convenience the use of parallel concatenation will be described. However, embodiments are not limited thereto.

In embodiments, the lengths of the message blocks $100_{ij}$ are decided in consideration of the following conditions in order to provide a protection level, that is, a number of erroneous symbols or bits that can be detected and/or corrected, among the message blocks $100_{ij}$ that is substantially as constant as possible:

i) Length differences between the message blocks $100_{ij}$ are minimized, ii) Length differences between the row message blocks $110_i$ are minimized, and iii) Length differences between the column message blocks $120_j$ are minimized.

In an embodiment, the maximum length differences allowed by the above conditions i), ii), and iii) may be 1.

First, the lengths of the row message blocks $110_i$ satisfying the condition ii) may be decided by Equation 1, wherein N is a length of the message, $\lfloor x \rfloor$ is a floor function returning the largest integer less than x, and $\lceil x \rceil$ is a ceiling function returning the smallest integer greater than x:

$$L_{rs} = \left\lfloor \frac{N}{N_r} \right\rfloor, L_{rl} = \left\lceil \frac{N}{N_r} \right\rceil \qquad \text{Equation 1}$$

In Equation 1, $L_{rs}$ corresponds to a shorter row length among the row message blocks $110_i$, and $L_{rl}$ corresponds to a longer row length among the row message blocks $110_i$. In Equation 1 above, when the remainder of $N/N_r$ is 0, that is, when N is an integer multiple of $N_r$, $L_{rl}=L_{rs}$, and when the remainder of $N/N_r$ is not 0, $L_{rl}=L_{rs}+1$. Accordingly, the condition ii) is satisfied.

For example, when the length N of a message is 32768, the number of row message blocks $N_r$ is 12, and the number of column message blocks $N_c$ is 11, the shorter row length $L_{rs}$ is 2730 and the longer row length $L_{rl}$ is 2731. Among the entire number $N_r$ of the row message blocks, the number γ of row message blocks having the longer row length $L_{rl}$ is 8, as can be verified using Equation 2, below, or calculated using the equivalent Equation 2.1. The number of row message blocks having the shorter row length $L_{rs}$ is $N_r-\gamma=4$.

$$\gamma \times L_{rl} + (N_r-\gamma) \times (L_{rl}-1) = N \qquad \text{Equation 2}$$

$$\gamma = N - N_r \times (L_{rl}-1) \qquad \text{Equation 2.1}$$

Figure 3:
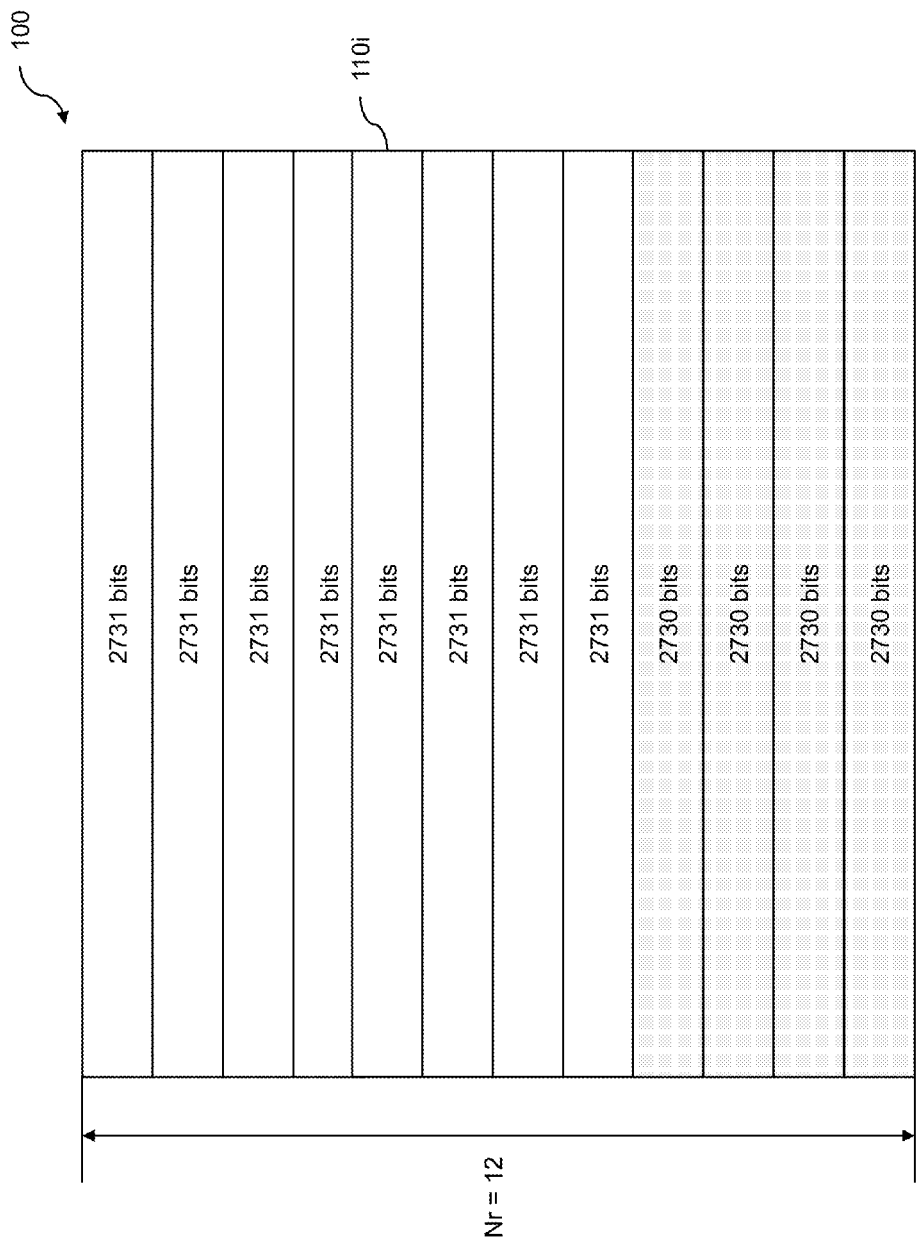
FIG. 3 is a diagram illustrating lengths of row message blocks of a message matrix according to an embodiment.

FIG. 3 illustrates a result obtained by deciding the lengths of the row message blocks $110_i$ of the message matrix 100 according to the above example.

The message matrix 100 includes a total number $N_r \times N_c$ of message blocks $100_{ij}$. A longer block length $B_l$ and a shorter block length $B_s$ of the message blocks $100_{ij}$ may be determined using the following Equation 3:

$$B_l = \left\lceil \frac{N}{N_r \times N_c} \right\rceil, B_s = \left\lfloor \frac{N}{N_r \times N_c} \right\rfloor \qquad \text{Equation 3}$$

In Equation 3 above, when the remainder of $N/(N_r \times N_c)$ is 0, $B_l=B_s$, and when the remainder of $N/(N_r \times N_c)$ is not 0, $B_l=B_s+1$. Accordingly, the condition i) is satisfied. When Equation 3 is applied to the aforementioned example, the longer block length $B_l$ is 249 and the shorter block length $B_s$ is 248.

By using an equation similar to Equation 2.1, such as Equation 3.1, below, the number of message blocks $N_{Bl}$ having the longer block length $B_l$ and the number of message blocks $N_{Bs}$ having the shorter block length $B_s$ in a row having a length $L_r$ may be determined.

$$N_{Bl}=L_r-N_c \times (B_l-1); N_{Bs}=N_c-N_{Bl} \qquad \text{Equation 3.1}$$

Accordingly, in a row having a length of 2731, the number of message blocks having a longer block length $B_l$ of 249 is 3. In a row having a length of 2730, the number of message blocks having the longer block length $B_l$ of 249 is 2.

Figure 4:
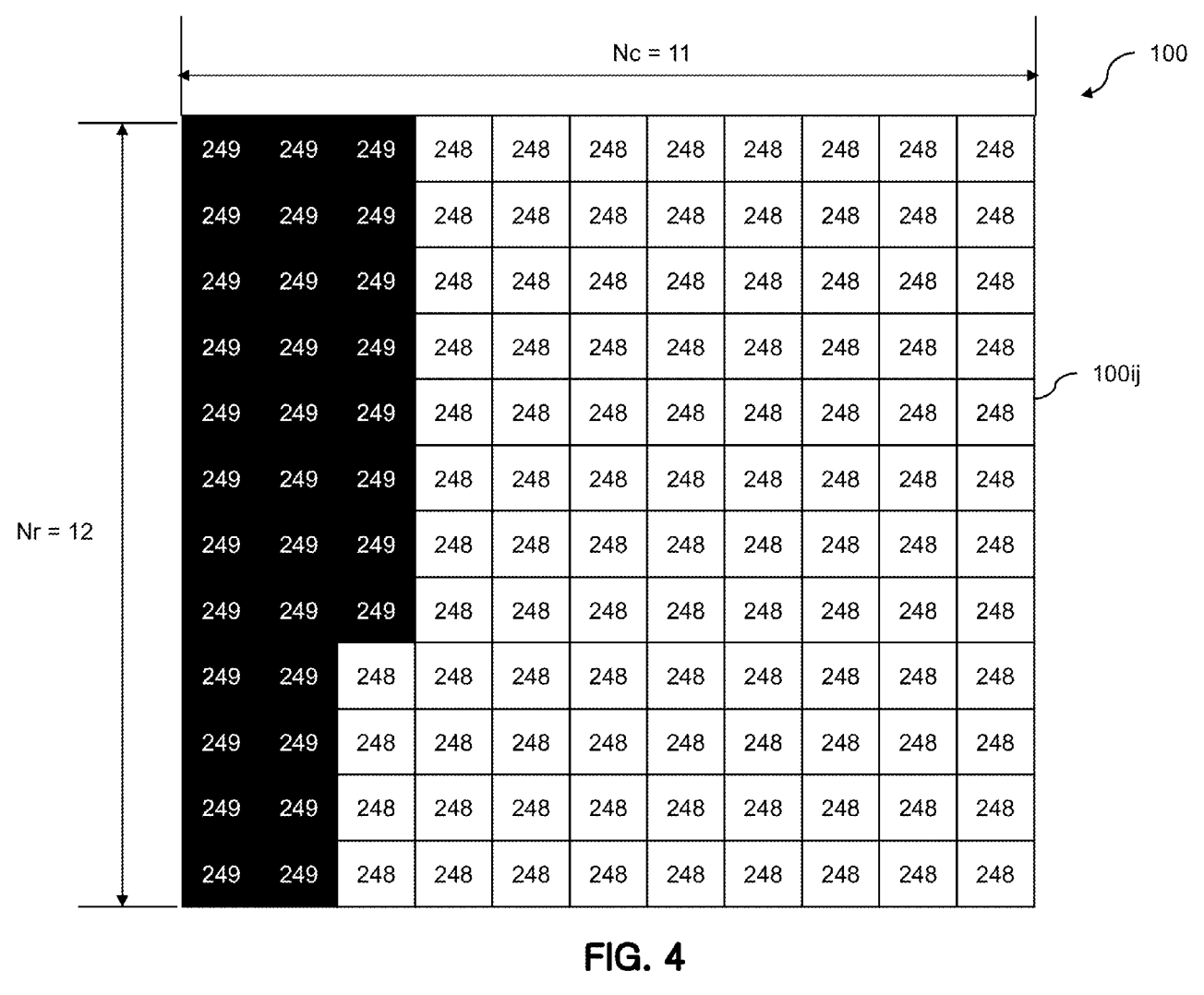

FIG. 4 illustrates the lengths of message blocks $100_{ij}$ included in each row of the message matrix 100. Row message blocks having a longer row length $L_{rl}$ of 2731 in FIG. 3 each include 3 message blocks having the longer block length $B_l$ of 249, and row message blocks having a shorter row length $L_{rs}$ of 2730 in FIG. 3 each include 2 message blocks having the longer block length $B_l$ of 249. The remaining message blocks each have the shorter block length $B_s$.

The message matrix 100 illustrated in FIG. 4 does not satisfy the aforementioned condition iii). In order to satisfy the condition iii), the positions of longer message blocks and shorter message blocks in each row are determined according to a process illustrated in FIG. 5.

Figure 5:
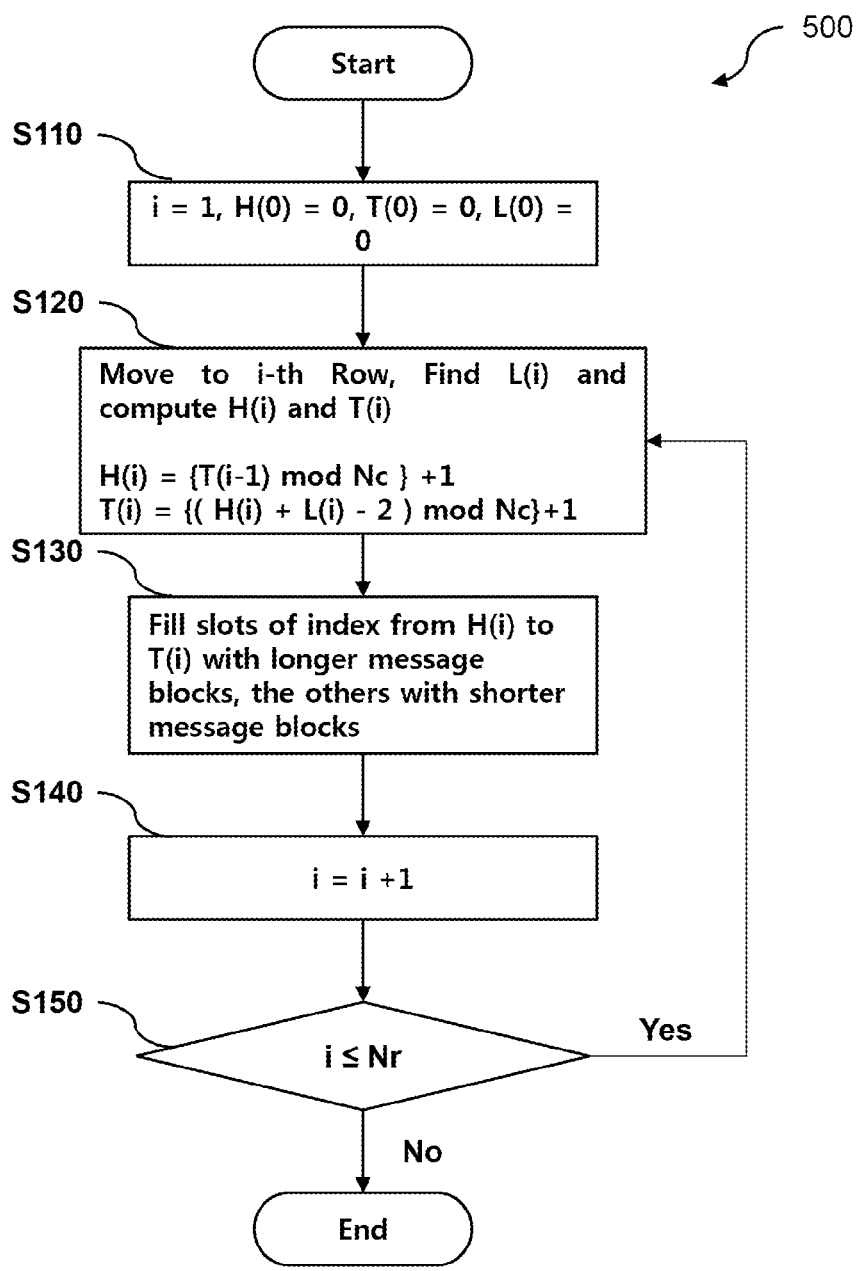
FIG. 5 is a flowchart illustrating a process for deciding the length of each message block of a message matrix according to an embodiment.

FIG. 5 is a flowchart illustrating a process 500 for determining the allocation of lengths of message blocks in each row message block according to an embodiment. In FIG. 5, i is a row index indicating an $i^{th}$ row message block. L(i) indicates the number of longer message blocks included in the $i^{th}$ row message block. H(i) indicates a column index of an initial longer message block arranged in the $i^{th}$ row message block, and T(i) indicates a column index of a final longer message block arranged in the $i^{th}$ row message block.

At S110, variables are initialized. The row index i is initialized to 1, and H(0), T(0), and L(0) are initialized to 0.

At S120, in the $i^{th}$ row message block, the number L(i) of longer message blocks included in the $i^{th}$ row message block is determined. After L(i) is determined, H(i) and T(i) are determined according to the following Equations 4 and 5, respectively.

$$H(i) = (T(i-1) \mod N_c) + 1 \quad \text{Equation 4}$$

$$T(i) = ((H(i) + L(i) - 2) \mod N_c) + 1 \quad \text{Equation 5}$$

For example, in the message block shown in FIG. 4, when i is 1, since T(0) is 0 and L(1) is 3, H(1) is calculated to be 1 and T(1) is calculated to be 3.

At S130, longer message blocks are allocated from an $H(i)^{th}$ column to a $T(i)^{th}$ column of the $i^{th}$ row, and shorter message blocks are allocated in the other columns. When H(i) is larger than T(i), longer message blocks are allocated from the $H(i)^{th}$ column to the last column and from the first column to the $T(i)^{th}$ column, and shorter message blocks are allocated in the other columns.

At S140, the row index i is increased. At S150, the row index i is compared to the number of rows $N_r$, and if the row index i is less than or equal to the number of rows Nr, the procedure proceeds to S120 and the aforementioned operations are repeated; otherwise, the process 500 ends.

In an embodiment, the allocation of longer and shorter message blocks within a row message block does not change the ordering of the message information in the row message block. For example, consider an $i^{th}$ row message block having a row length $L_r$ of 2731 symbols and including 3 message blocks having a longer block length $B_l$ of 249 and 8 message blocks having a shorter block length $B_s$ of 248 in such an embodiment. If H(i) is 1, then only the first through three message blocks of the row i will be longer message blocks, and the first through fifth message blocks will contain symbols 1-249, 250-498, 499-747, 748-995, and 996-1243 of the row message block, respectively. But if instead H(i) is 2, then only the second through fourth message blocks of the row i will be longer message blocks, and the first through fifth message blocks will contain symbols 1-248, 249-497, 499-746, 747-995, and 996-1243 of the row message block, respectively.

Figure 6:
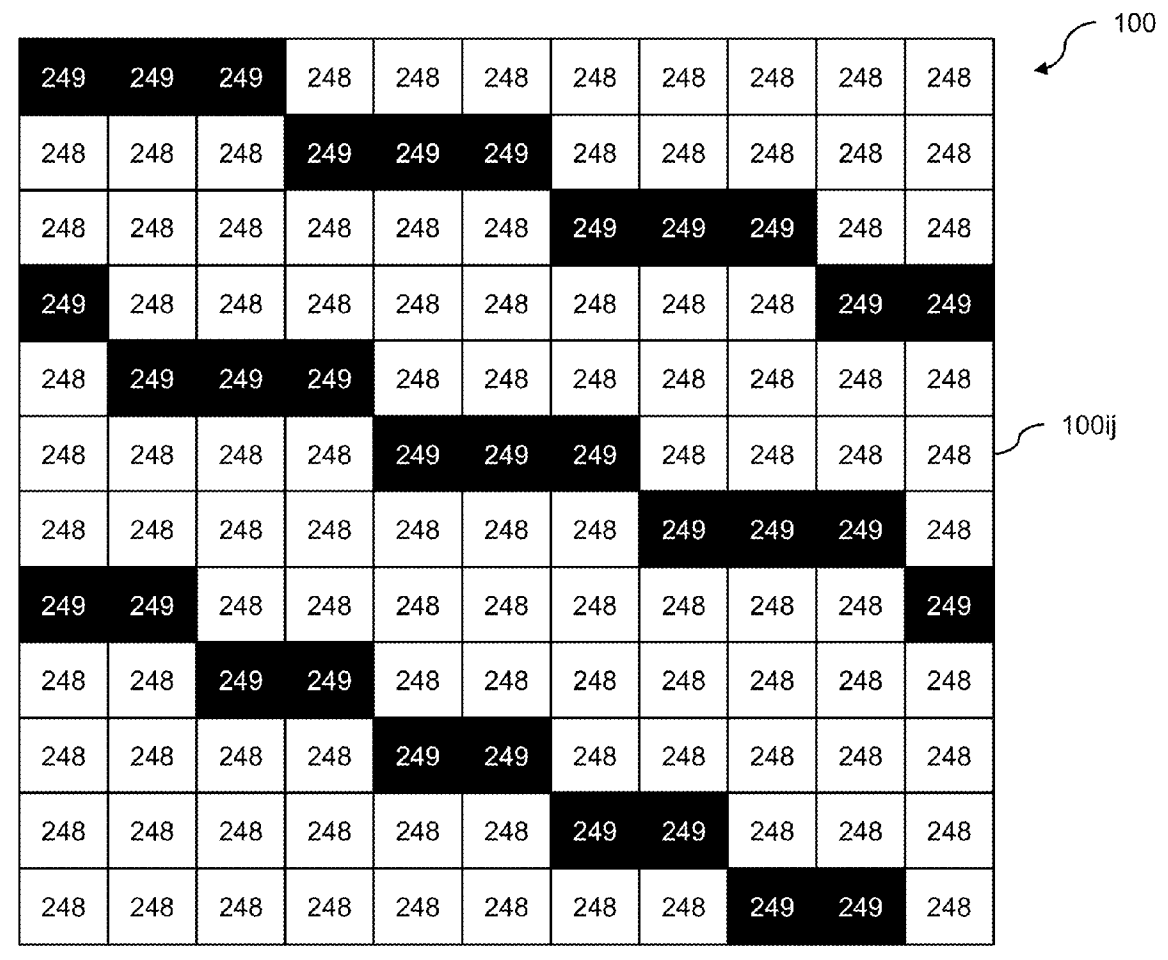

FIG. 6 is a diagram illustrating a message matrix 100 obtained by arranging the message blocks $100_{ij}$ according to the process of FIG. 5. The number of longer message blocks and the number of shorter message blocks in each row message block are decided as illustrated in FIG. 4.

In a first row message block, the longer message blocks are sequentially allocated from a first column, and in a next row, longer message blocks are continuously allocated from a column next to a column in which the final longer message block has been allocated in a first row. As shown in the a fourth row, when the last column is reached during the allocation of the longer message blocks, the longer message blocks are sequentially allocated from a first column of the corresponding row message block.

In this way, when the allocation of the longer message blocks and the shorter message blocks within the last row is complete, the difference among the lengths of the column message blocks included in the message matrix 100 is at most 1, so that the aforementioned condition iii) is satisfied.

In the message matrix 100 shown in FIG. 6, after the length of each message block $100_{ij}$ of the message matrix 100 is decided, the positions of two rows may be exchanged or the positions of two columns may be exchanged in the message matrix 100, and the aforementioned conditions i), ii), and iii) will still be satisfied.

In an embodiment, the length of each of row message blocks $110_i$ of the message matrix 100 are decided, and then the length of each of the column message blocks $120_j$ are decided. In another embodiment, the length of each of the column message block $120_j$ of the message matrix 100 may be decided, and then the length of each of the row message blocks $110_i$ may be decided. The number of message blocks $100_{ij}$ having the longer message block length $B_l$ may be determined within each column message block $120_j$, and then the message blocks $100_{ij}$ having the longer message block length $B_l$ may be arranged within each column message block $120_j$ so that condition ii) is satisfied for row message blocks $110_i$, using a transposed version of the process 500 illustrated in FIG. 5.

Figure 7:
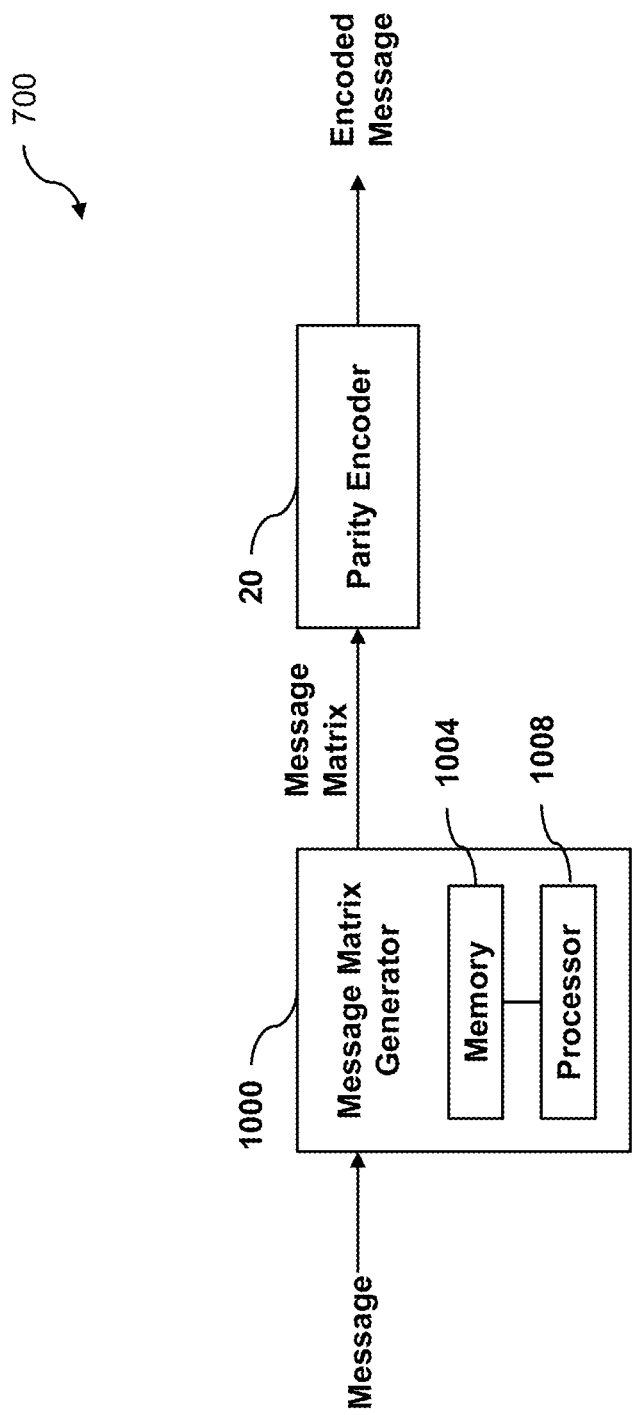
FIG. 7 is a block diagram of an encoding device according to an embodiment.

FIG. 7 is a diagram illustrating an encoding device according to an embodiment. The encoding device 700 includes a message matrix generator 1000 and a parity encoder 20. The message matrix generator 1000 includes a memory 1004 and a processor 1008.

The memory 1004 may be any non-transitory computer-readable media, and may include one or more of Read-Only Memory (ROM), Programmable ROM, Random Access Memory (RAM), Flash memory, resistive memory, magnetic memory, and the like. The memory 1004 may include computer programming instructions stored therein.

The message matrix generator 1000 receives a message and generates a message matrix. An operation of the message matrix generator 1000 is as described with reference to FIG. 1 to FIG. 6. The operation of the message matrix generator 1000 may be performed using the processor 1008 when the processor 1008 executes computer programming instructions stored in the memory 1004.

When parity information and message information are parallel-concatenated as illustrated in FIG. 1, the message matrix 100 includes no row parity information. However, when the parity information and the message information are serial-concatenated as illustrated in FIG. 2, the message matrix 100 includes the row parity information. Accordingly, in an embodiment wherein the parity information and the message information are serial-concatenated as illustrated in FIG. 2, the message matrix 100 is generated using a sum of the length of the message and the length of the row parity information, in place of using the length of the message as would be the case when the parity information and the message information are parallel-concatenated. However, the message matrix generation process itself is the same as that in the case of parallel concatenation.

The message matrix generated as the result of the operation of the message matrix generator 1000 is provided to the parity encoder 20. The parity encoder 20 adds row parity information and column parity information to the message matrix. The parity encoder 20 applies one or more of a BCH code, a Hamming code, an RS code, or other parity, error correction, and/or error detection codes, and outputs an encoded message. A person of skill in the art, in light of the teachings and disclosures herein, would understand how to implement the parity encoder 20 using hardware, software, or combinations thereof.

The encoded message may be stored in a cell array of a semiconductor memory device, or may be transmitted through a communication channel.

Figure 8:
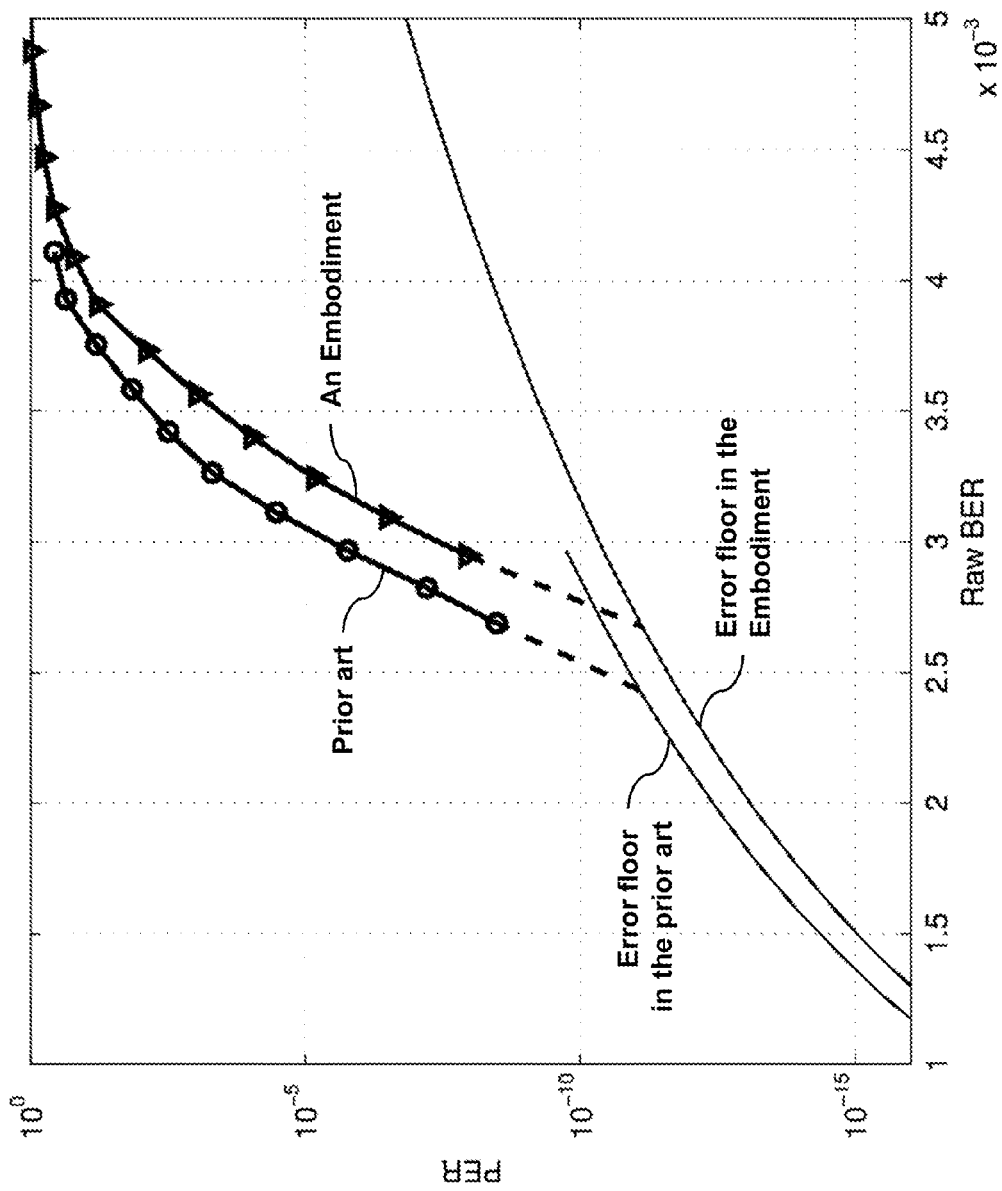
FIG. 8 is a graph illustrating the performance of an encoding device according to an embodiment.

FIG. 8 is a graph illustrating the effect of the encoding device according to an embodiment.

In FIG. 8, the graph according to the prior art indicates a result obtained by applying a BCH code to a message matrix wherein the lengths of message blocks are equal to one another. Specifically, in FIG. 8, the graph according to the prior art relates to a first case in which a number of row message blocks is 16, lengths of the row message blocks are 4096 bits, lengths of row parity blocks are 117 bits, and a protection level provided by row parities is 9 bits. A number of column message blocks is 16, a length of each of the column message blocks are 4096 bits, a length of each of the column parity blocks are 195 bits, and a protection level provided by each of the column parities is 15 bits. A length of the message matrix is 65536 bits and a total number of parity bits is 4992 bits.

A graph according to an embodiment of the present disclosure relates to a second case in which a number of longer row message blocks among row message blocks is 16, lengths of the longer row message blocks are 3856, a number of shorter row message blocks is 1, lengths of the shorter row message blocks are 3855 bits, lengths of row parity blocks are 108 bits, and a protection level provided by row parities is 9 bits. A number of shorter column message blocks among column message blocks is 16, lengths of the shorter column message blocks are 3855, a number of longer column message blocks is 1, lengths of the longer column message blocks are 3856 bits, lengths of column parity blocks are 180 bits, and a protection level provided by column parities is 15 bits. A length of a message matrix is 65536 bits and a total number of parity bits is 4896 bits.

According to the embodiment of the present disclosure, the length of the message matrix is equal to that in the prior art, but the length of the parity information is shorter.

In FIG. 8, a horizontal axis denotes a basic error rate of a memory cell as a 1 bit error rate (Raw BER), and a vertical axis denotes a page error rate after coding is applied as a page error rate (PER).

When the prior art is compared with the embodiment, if the page error rate is $10^{-10}$, the Raw BER corresponding to the page error rate is higher in the embodiment. Put another way, for any given value of the raw BER, embodiments of the present disclosure produce a lower page error rate than the prior art, thereby offering improved performance compared to the prior art. Furthermore, an error floor of embodiments of the present disclosure is lower than an error floor of the prior art.

While certain embodiments have been described above, it will be understood to those skilled in the art that the embodiments described are by way of illustration only. Accordingly, the encoding device and the method for generating a message matrix described herein should not be limited based on the described embodiments. Rather, the encoding device and the method for generating a message matrix described herein should only be limited in light of the claims that follow when taken in conjunction with the above description and accompanying drawings.

What is claimed is:

1. A method for generating a message matrix and encoding the message matrix, the message matrix comprising a plurality of message blocks, the method comprising:

determining a plurality of row lengths of respective rows of the message matrix such that a length difference between any of the plurality of row lengths is equal to or less than a critical point, each of the row lengths corresponding to the number of all units included in a corresponding one of the rows of the message matrix;

determining a plurality of message block lengths of the respective message blocks such that a length difference between any of the plurality of message block lengths is equal to or less than the critical point, each of the message block lengths corresponding to the number of all units included in a corresponding one of the plurality of message blocks;

arranging the message blocks in each row of the message matrix such that a length difference between any of a plurality of column lengths of respective columns of the message matrix is equal to or less than the critical point, each of the column lengths corresponding to the number of all units included in a corresponding one of the columns of the message matrix;

encoding each row of the message matrix to generate a plurality of row parity blocks; and encoding each column of the message matrix to generate a plurality of column parity blocks, wherein the plurality of message blocks are arranged along the rows and the columns of the message matrix.

2. The method according to claim 1, wherein the rows of the message matrix include a first row having a first row length and a second row having a second row length, wherein the second row length is less than the first row length.

3. The method according to claim 2, wherein, when a length of the message matrix is N, a number of the rows of the message matrix is $N_r$, and a number of the columns of the message matrix is $N_c$, the first row length is $$\left\lceil \frac{N}{N_r} \right\rceil$$

and the second row length is $$\left\lfloor \frac{N}{N_r} \right\rfloor.$$

4. The method according to claim 2, wherein the message blocks include one or more first blocks having a first block length and one or more second blocks having a second block length, wherein the second block length is less than the first block length.

5. The method according to claim 4, wherein, when a length of the message matrix is N, a number of the rows of the message matrix is $N_r$, and a number of the columns of the message matrix is $N_c$, the first block length is $$\left\lceil \frac{N}{N_r \times N_c} \right\rceil$$

and the second block length is $$\left\lfloor \frac{N}{N_r \times N_c} \right\rfloor.$$

6. The method according to claim 4, wherein arranging the message blocks in each row of the message matrix comprises:
continuously arranging one or more of the first blocks from a first initial column to a first end column in a row of the message matrix.

7. The method according to claim 6, wherein, after one or more of the first blocks are arranged up to a last column of the message matrix in the row, when one or more of the first blocks remain, the remaining one or more first blocks are arranged from a first column of the row.

8. The method according to claim 6, wherein the row is a first row and one or more of the first blocks are continuously arranged from a second initial column in a second row different from the first row to a second end column in the second row, and the second initial column is a column next to the first end column.

9. The method according to claim 8, wherein, when the first end column is a last column, the second initial column is a first column.

10. The method according to claim 1, wherein the critical point is 1.

11. A method for generating a message matrix and encoding the message matrix, the message matrix comprising a plurality of message blocks, the method comprising:
determining a plurality of column lengths of respective columns of the message matrix such that a length difference between any of the plurality of column lengths is equal to or less than a critical point, each of the column lengths corresponding to the number of all units included in a corresponding one of the columns of the message matrix;
determining a plurality of message block lengths of the respective message blocks such that a length difference between any of the plurality of message block lengths is equal to or less than the critical point, each of the message block lengths corresponding to the number of all units included in a corresponding one of the plurality of message blocks;
arranging the message blocks in each column of the message matrix such that a length difference between any of a plurality of row lengths of respective rows of the message matrix is equal to or less than the critical point, each of the row lengths corresponding to the number of all units included in a corresponding one of the rows of the message matrix;
encoding each row of the message matrix to generate a plurality of row parity blocks; and
encoding each column of the message matrix to generate a plurality of column parity blocks,
wherein the plurality of message blocks are arranged along the rows and the columns of the message matrix.

12. An encoding device comprising:
a message matrix generator that generates a message matrix in which a plurality of message blocks are arranged in a lattice form such that a length difference of rows of the message matrix is equal to or less than a critical point, a length difference of the message blocks is equal to or less than the critical point, and a length difference of columns of the message matrix is equal to or less than the critical point, and
a parity encoder that generates a parity code of the message matrix,
wherein the parity code comprises a plurality of row parity blocks and a plurality of column parity blocks, the parity encoder encodes each of the rows of the message matrix to generate the plurality of row parity blocks, and the parity encoder encodes each of the columns of the message matrix to generate the plurality of column parity blocks, and
wherein a length of a row of the message matrix corresponds to the number of all units included in the row, a length of a message block corresponds to the number of all units included in the message block, and a length of a column of the message matrix corresponds to the number of all units included in the column.

13. The encoding device according to claim 12, wherein the parity encoder generates the parity code by applying one or more of a BCH code, a hamming code, and an RS code.

14. The encoding device according to claim 12, wherein the message matrix generator is configured to determine a length of a row of the message matrix as $$\left\lceil \frac{N}{N_r} \right\rceil$$

or $$\left\lfloor \frac{N}{N_r} \right\rfloor.$$

when a length of the message matrix is N, a number of the rows of the message matrix is $N_r$, and a number of the columns of the message matrix is $N_c$.

15. The encoding device according to claim 14, wherein the message matrix generator is configured to determine a length of a message block of the message matrix as $$\left\lceil \frac{N}{N_r \times N_c} \right\rceil \text{ or } \left\lfloor \frac{N}{N_r \times N_c} \right\rfloor.$$

16. The encoding device according to claim 12, wherein the message matrix generator is configured to determine a length of a column of the message matrix as $$\left\lceil \frac{N}{N_c} \right\rceil$$

or $$\left\lfloor \frac{N}{N_c} \right\rfloor.$$

when a length of the message matrix is N, a number of the rows of the message matrix is $N_r$, and a number of the columns of the message matrix is $N_c$.

17. The encoding device according to claim 16, wherein the message matrix generator is configured to determine a length of a message block of the message matrix as $$\left\lceil \frac{N}{N_r \times N_c} \right\rceil \text{ or } \left\lfloor \frac{N}{N_r \times N_c} \right\rfloor.$$

18. The method according to claim 1, wherein a unit is any of a bit and a symbol.

19. The method according to claim 11, wherein a unit is any of a bit and a symbol.

20. The encoding device according to claim 12, wherein a unit is any of a bit and a symbol.

\* \* \* \* \*